(12) United States Patent
Kinoshita et al.

(10) Patent No.: US 10,644,199 B2
(45) Date of Patent: May 5, 2020

(54) GROUP III NITRIDE STACKED BODY, AND SEMICONDUCTOR DEVICE HAVING THE STACKED BODY

(71) Applicant: STANLEY ELECTRIC CO., LTD., Meguro-ku, Tokyo (JP)

(72) Inventors: Toru Kinoshita, Tokyo (JP); Toshiyuki Obata, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/331,119

(22) PCT Filed: Aug. 28, 2017

(86) PCT No.: PCT/JP2017/030706
§ 371 (c)(1),
(2) Date: Mar. 6, 2019

(87) PCT Pub. No.: WO2018/051772
PCT Pub. Date: Mar. 22, 2018

(65) Prior Publication Data
US 2019/0229237 A1    Jul. 25, 2019

(30) Foreign Application Priority Data

Sep. 14, 2016 (JP) .................. 2016-179114

(51) Int. Cl.
*H01L 33/32* (2010.01)
*C30B 29/38* (2006.01)
(Continued)

(52) U.S. Cl.
CPC .............. *H01L 33/32* (2013.01); *C23C 16/34* (2013.01); *C30B 25/02* (2013.01); *C30B 25/18* (2013.01);
(Continued)

(58) Field of Classification Search
CPC ......... C30B 25/02; C30B 29/38; C30B 25/18; C23C 16/34; H01L 33/12; H01L 33/32; H01L 33/0075; H01L 21/205
See application file for complete search history.

(56) References Cited

U.S. PATENT DOCUMENTS 6,130,147 A * 10/2000 Major .................. H01L 33/32
438/47
2008/0187016 A1    8/2008 Schowalter et al.
(Continued)

FOREIGN PATENT DOCUMENTS

JP        2006-351640      * 12/2006
JP        2010517298 A       5/2010
(Continued)

OTHER PUBLICATIONS

International Search Report (ISR) dated Nov. 7, 2017 issued in International Application No. PCT/JP2017/030706.
(Continued)

*Primary Examiner* — Ahmed N Sefer
(74) *Attorney, Agent, or Firm* — Holtz, Holtz & Volek PC

(57) ABSTRACT

Provided is a group III nitride stacked body having an n-type $Al_XGa_{1-X}N$ ($0.5 \leq X < 1$) layer formed on an AlN single crystal substrate while being lattice-matched to the AlN single crystal substrate wherein the n-type $Al_XGa_{1-X}N$ ($0.5 \leq X < 1$) layer has at least a stacked structure in which a first n-type $Al_{X1}Ga_{1-X1}N$ ($0.5 \leq X1 < 1$) layer, a second n-type $Al_{X2}Ga_{1-X2}N$ ($0.5 \leq X2 < 1$) layer, and a third n-type $Al_{X3}Ga_{1-X3}N$ ($0.5 \leq X3 < 1$) layer are stacked in this order from the AlN single crystal substrate side, and X1, X2, and X3 indicating the Al compositions of the respective layers satisfy $0 < |X1-X2| \leq 0.1$, and satisfy $0 < |X2-X3| \leq 0.1$.

5 Claims, 3 Drawing Sheets

(51) Int. Cl.
C30B 25/02 (2006.01)
C23C 16/34 (2006.01)
H01L 21/205 (2006.01)
C30B 25/18 (2006.01)
H01L 33/00 (2010.01)
H01L 33/12 (2010.01)

(52) U.S. Cl.
CPC ............ C30B 29/38 (2013.01); H01L 21/205 (2013.01); H01L 33/0075 (2013.01); H01L 33/12 (2013.01)

(56) References Cited

U.S. PATENT DOCUMENTS

| | | | |
|---|---|---|---|
| 2009/0179221 A1* | 7/2009 | Han | H01L 33/025 257/103 |
| 2010/0135349 A1 | 6/2010 | Schowalter et al. | |
| 2013/0292687 A1* | 11/2013 | Jiang | H01L 31/03048 257/76 |
| 2013/0307001 A1* | 11/2013 | Lee | H01L 33/12 257/94 |
| 2013/0328106 A1 | 12/2013 | Kokawa et al. | |
| 2015/0200257 A1 | 7/2015 | Kim et al. | |
| 2017/0110852 A1* | 4/2017 | Mino | H01L 33/02 |
| 2017/0201072 A1* | 7/2017 | Kotani | H01S 5/3202 |

FOREIGN PATENT DOCUMENTS

| | | |
|---|---|---|
| JP | 2012243868 A | 12/2012 |
| JP | 2015135946 A | 7/2015 |

OTHER PUBLICATIONS

Written Opinion dated Nov. 7, 2017 issued in International Application No. PCT/JP2017/030706.

James R. Grandusky, et al., "Properties of Mid-Ultraviolet Light Emitting Diodes Fabricated from Pseudomorphic Layers on Bulk Aluminum Nitride Substrates," Applied Physics Express 3 (2010) 072103, 3 Pages.

James R. Grandusky, et al., "270 nm Pseudomorphic Ultraviolet Light-Emitting Diodes with Over 60 mW Continuous Wave Output Power," Applied Physics Express 6 (2013) 032101, 3 Pages.

James R. Grandusky, et al., "Pseudomorphic growth of thick n-type $Al_xGa_{1-x}N$ layers on low-defect-density bulk AlN substrates for UV LED applications," Journal of Crystal Growth 311 (2009), pp. 2864-2866.

Cyril Pernot, et al., "Improved Efficiency of 255-280 nm AlGaN-Based Light-Emitting Diodes," Applied Physics Express 3 (2010) 061004, 3 Pages.

* cited by examiner

GROUP III NITRIDE STACKED BODY, AND SEMICONDUCTOR DEVICE HAVING THE STACKED BODY

TECHNICAL FIELD

The present invention relates to a novel Group III nitride stacked body applicable to semiconductor devices and the like, and also to a novel ultraviolet light-emitting element having the stacked body.

BACKGROUND ART

Single crystal group III nitride semiconductors represented by the composition formula $Al_AGa_{1-A}N$ ($0 \leq A \leq 1$) can freely select the emission peak wavelength in the range of 210 to 365 nm by changing the composition of the group III element (Al, Ga), and have direct transition-type band structures in the energy range corresponding to the above-described wavelength range. Thus, they are optimal materials for forming ultraviolet light-emitting elements.

Ultraviolet light-emitting elements formed of group III nitride semiconductors are generally manufactured by performing crystal-growth of an $Al_AGa_{1-A}N$ layer on a single crystal substrate by a metal organic chemical vapor deposition method (MOCVD) or a molecular beam epitaxy method (MBE). As a single crystal substrate, materials such as sapphire, SiC (silicon carbide), AlN (aluminum nitride), or the like, which enable epitaxial growth of an $Al_AGa_{1-A}N$ layer, may be used. Among these, it is known that use of an AlN single crystal substrate which is the same group III nitride as the $Al_AGa_{1-A}N$ layer can reduce crystal defects (dislocations) formed in the $Al_AGa_{1-A}N$ layer.

For example, Non-Patent Literatures 1 and 2 disclose that the dislocation density in the $Al_AGa_{1-A}N$ layer can be reduced by fabricating an ultraviolet light-emitting diode including a stacked structure having an $Al_AGa_{1-A}N$ layer lattice-matched to, and formed on, an AlN single crystal substrate. Non-Patent Literatures 1 and 2 disclose an ultraviolet light-emitting diode having an emission peak wavelength of 280 nm or less. When a flip-chip type ultraviolet light-emitting element described in these Non-Patent Literatures 1 and 2 is fabricated, it is preferable that the n-type $Al_AGa_{1-A}N$ layer formed on the AlN single crystal substrate have high conductivity and a large film thickness in order to reduce the driving voltage of the ultraviolet light-emitting element.

Specifically, the film thickness of such an $Al_AGa_{1-A}N$-layer has been reported as follows. For example, Non-Patent Literature 3 reports the physical properties of an $Al_AGa_{1-A}N$ layer formed on an AlN single crystal substrate. Specifically, when the $Al_{0.6}Ga_{0.4}N$ layer (Al composition (A) is 0.6) has a film thickness of 0.5 μm or less, and when the $Al_{0.7}Ga_{0.3}N$ layer (Al composition (A) is 0.7) has a film thickness of 1.0 μm or less, the lattice constant of the $Al_AGa_{1-A}N$ layer is maintained to be equal to (lattice-matched to) the lattice constant of the AlN single crystal substrate. Non-Patent Literature 3 also reports that, if this condition is satisfied, $Al_AGa_{1-A}N$ layers having good surface smoothness and high crystal qualities can be obtained.

In addition, Patent Literature 1 discloses an $Al_AGa_{1-A}N$ layer which is formed on an AlN single crystal substrate, and whose film thickness is 5 times or more the predicted critical film thickness calculated in accordance with the Matthews-Blakeslee theory (hereinafter, referred to as MB theory in some cases) and whose mean dislocation density is $10^4$ cm$^{-2}$ or less (Note that Patent Literature 1 describes the unit of the predicted critical film thickness as Å in the drawing showing the relation between the Al composition and the predicted critical film thickness by the MB theory, but it is presumed that it is wrong, and should be nm (nanometer)).

As described above, Non-Patent Literature 3 and Patent Literature 1 disclose relatively thick n-type $Al_AGa_{1-A}N$ layers formed on, and lattice-matched to, the AlN single crystal substrate.

CITATION LIST

Patent Literature

Patent Literature 1: Japanese Translation of PCT Patent Application Publication No. 2010-517298

Non-Patent Literature

Non-Patent Literature 1: Appl. Phys. Express 3, 072103 (2010)

Non-Patent Literature 2: Appl. Phys. Express 6, 032101 (2013)

Non-Patent Literature 3: J. Cryst. Growth 311, 2864-2866 (2009)

Non-Patent Literature 4: Appl. Phys. Express 3, 061004 (2010)

SUMMARY OF INVENTION

Technical Problem

However, even with the methods described above, there is room for improvement in the following points in order to obtain an ultraviolet light-emitting element having higher performance, specifically, driven with a lower driving voltage.

For example, Non-Patent Literature 4 discloses an ultraviolet light-emitting element having an n-type $Al_{0.67}Ga_{0.33}N$ layer of 2 μm on a sapphire substrate. Since the n-type $Al_{0.67}Ga_{0.33}N$ layer is formed on the sapphire substrate, the dislocation density is increased. However, since the resistance value in the horizontal (lateral) direction thereof in the n-type $Al_AGa_{1-A}N$ layer is the reciprocal of the cross-sectional area (product of the width and the film thickness) through which a current flows, the resistance value in the horizontal direction in the n-type $Al_{0.67}Ga_{0.33}N$ layer of Non-Patent Literature 4 is, for example, a half or less of that in the n-type $Al_{0.6}Ga_{0.4}N$ layer (0.5 μm) and the n-type $Al_{0.7}Ga_{0.3}N$ layer (1.0 μm) of Non-Patent Literature 3.

It is considered that the difference in resistance value in the horizontal direction in the n-type $Al_AGa_{1-A}N$ layer caused by the difference in film thickness is one of the reasons for the higher driving voltage of the ultraviolet light-emitting element fabricated on the AlN substrate. As described above, in the conventional technology, there is room for improvement in the ultraviolet light-emitting element including the AlN single crystal substrate and the n-type $Al_AGa_{1-A}N$ layer lattice-matched to the AlN single crystal substrate from the viewpoint of lowering a driving voltage.

Accordingly, it is an object of the present invention to provide a group III nitride stacked body having an n-type $Al_XGa_{1-X}N$ ($0.5 \leq X < 1$) layer lattice-matched to, and formed on, an AlN single crystal substrate, the group III nitride stacked body having high crystal qualities (high crystallinity and low dislocation density) and capable of improving the n-type conductivity in the horizontal direction (capable of being driven with a lower driving voltage).

Solution to Problem

In order to solve the above-described problems, the present inventors have intensively studied structures of n-type $Al_xGa_{1-x}N$ (0.5≤X<1) layers formed on an AlN single crystal substrate. As a result, they have found that, when the n-type $Al_xGa_{1-x}N$ (0.5≤X<1) layer is formed from a plurality of layers of at least three or more layers each having a particular composition differing in Al composition, the n-type $Al_xGa_{1-x}N$ (0.5≤X<1) layer can maintain a state of being lattice-matched to the AlN single crystal substrate, i.e., is capable of improving the conductivity in the horizontal direction while maintaining high crystalline quality, and thus, completed the present invention.

That is, a first aspect of the present invention is a group III nitride stacked body having an n-type $Al_xGa_{1-x}N$ (0.5≤X<1) layer formed on an AlN single crystal substrate while being lattice-matched to the AlN single crystal substrate wherein the n-type $Al_xGa_{1-x}N$ (0.5≤X<1) layer has at least a stacked structure in which a first n-type $Al_{x1}Ga_{1-x1}N$ (0.5≤X1<1) layer, a second n-type $Al_{x2}Ga_{1-x2}N$ (0.5≤X2<1) layer, and a third n-type $Al_{x3}Ga_{1-x3}N$ (0.5≤X3<1) layer are stacked in this order from the AlN single crystal substrate side, and X1, X2, and X3 indicating the Al compositions of the respective layers satisfy 0<|X1−X2|≤0.1, and satisfy 0<|X2−X3|≤0.1.

As described above, X denotes the value of the Al composition (Al composition ratio) in the n-type $Al_xGa_{1-x}N$ (0.5≤X<1) layer. Thus, X satisfies all values of X1, X2, and X3. In addition, X1, X2, and X3 denote values of the Al compositions (Al composition ratios) in the first n-type $Al_{x1}Ga_{1-x1}N$ (0.5≤X1<1) layer, the second n-type $Al_{x2}Ga_{1-x2}N$ (0.5≤X2<1) layer, and the third n-type $Al_{x3}Ga_{1-x3}N$ (0.5≤X3<1) layer, respectively.

Of course, |X1−X2| refers to the absolute value of the difference between X1 and X2, and |X2−X3| refers to the absolute value of the difference between X2 and X3.

In the first aspect of the present invention, in order to further lower the driving voltage, the aforementioned X1, X2, and X3 preferably satisfy X1<X2 and X3<X2, or satisfy X2<X1 and X2<X3, and further preferably satisfy X1<X2<X3.

In the first aspect of the present invention, it is preferable that the film thickness of each layer of the first n-type $Al_{x1}Ga_{1-x1}N$ (0.5≤X1<1) layer, the second n-type $Al_{x2}Ga_{1-x2}N$ (0.5≤X2<1) layer, and the third n-type $Al_{x3}Ga_{1-x3}N$ (0.5≤X3<1) layer be 1 time or more and less than 5 times the predicted critical film thickness. This can achieve a group III nitride stacked body with a higher quality, i.e., a lower dislocation density. Further, in order to facilitate handling of the obtained group III nitride stacked body and further lower the driving voltage, it is preferable that the total thickness of the n-type $Al_xGa_{1-x}N$ (0.5≤X<1) layer be 500 nm or more.

A second aspect of the present invention is a semiconductor device having the group III nitride stacked body according to the first aspect of the present invention, which can be applied to an ultraviolet light-emitting element or the like having an emission peak wavelength of 210 to 350 nm.

Advantageous Effects of the Invention

According to the present invention, there is provided a group III nitride stacked body including an n-type $Al_x Ga_{1-x}N$ (0.5≤X<1) layer formed on an AlN single crystal substrate while being lattice-matched to the AlN single crystal substrate, wherein the resistance value of the n-type $Al_xGa_{1-x}N$ (0.5≤X<1) layer in the horizontal direction is reduced. For example, when an ultraviolet light-emitting element (semiconductor device) having an emission peak wavelength of 350 nm or less is fabricated from the group III nitride stacked body, an ultraviolet light-emitting element (semiconductor device) driven with a low driving voltage can be obtained in addition to high emission efficiency and reliability.

DESCRIPTION OF EMBODIMENTS

Figure 1:
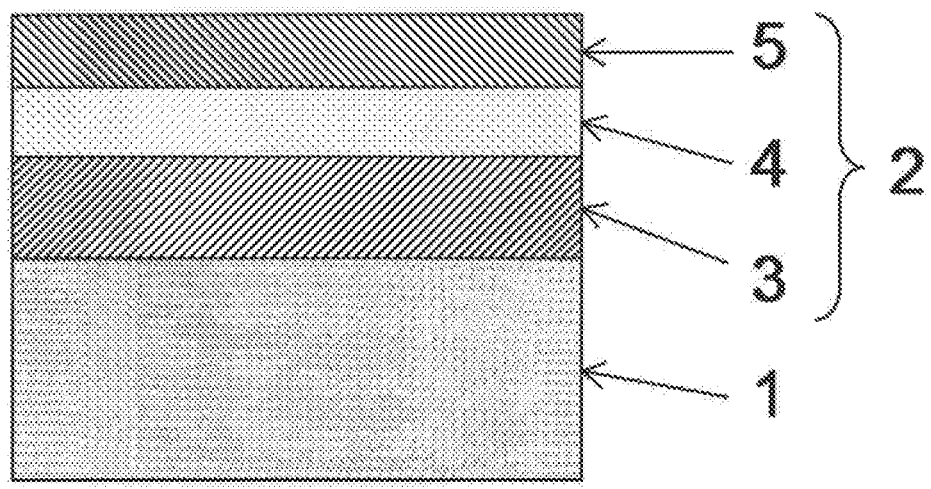
FIG. 1 is a schematic view (schematic cross-sectional view) of an example showing a structure of a group III nitride stacked body of the present invention.

The group III nitride stacked body is a group III nitride stacked body having an AlN single crystal substrate and an n-type $Al_xGa_{1-x}N$ (0.5≤X<1) layer formed on the AlN single crystal substrate while being lattice-matched to the AlN single crystal substrate. Hereinafter, the structure of FIGS. 1 and 2 will be described in order by way of example.

(Group III Nitride Stacked Body)

(AlN Single Crystal Substrate)

In the present invention, the AlN single crystal substrate 1 serving as a base substrate is not particularly limited, but it is preferable to use an AlN single crystal substrate having a low dislocation density. Specifically, the AlN single crystal substrate 1 preferably has a dislocation density of $10^6$ cm$^{-2}$ or less, and more preferably has a dislocation density of $10^4$ cm$^{-2}$ or less. Use of the AlN single crystal substrate 1 having a low dislocation density can lower the dislocation density in the n-type $Al_xGa_{1-x}N$ (0.5≤X<1) layer 2, and improve the characteristics of the ultraviolet light-emitting element. The lower limit of the dislocation density is 0 cm$^{-2}$. In the present invention, unless otherwise specified, the dislocation density is an etch pit density measured after immersion in a heated acid mixed solution described later.

In the present invention, the crystal growth surface of the AlN single crystal substrate 1, that is, the crystal plane on which the n-type $Al_xGa_{1-x}N$ (0.5≤X<1) layer 2 is grown is not particularly limited as long as the structure of the present invention can be realized. Among these, from the viewpoint of enhancing the smoothness of the n-type $Al_xGa_{1-x}N$ layer 2, the C-plane is preferable. In addition, the surface may be slightly inclined (off) from the C-plane, and in this case, the off-angle is preferably 0.1 to 0.5°, and further preferably inclined in the M-axis direction.

The crystal growth surface of the AlN single crystal substrate 1 is preferably smooth. The smoothness makes it possible to reduce new dislocations generated at the interface with the n-type $Al_XGa_{1-X}N$ ($0.5 \leq X < 1$) layer 2 stacked on the AlN single crystal substrate 1. Specifically, the root-mean-square roughness (RMS) in the area of 5×5 μm² is preferably 5 nm or less, more preferably 1 nm or less, and further preferably 0.5 nm or less. Such a smooth surface can be obtained by a known Chemical Mechanical Polish process (CMP polishing). The lower limit value of RMS is preferably 0 nm, but is 0.05 nm in the current technology in consideration of industrial production.

Further, when damage by CMP polishing remains on the crystal growth surface of the AlN single crystal substrate 1, lattice relaxation of the n-type $Al_XGa_{1-X}N$ ($0.5 \leq X < 1$) layer 2 may occur, and dislocations may newly occur. Therefore, it is necessary to suppress the polishing damage as much as possible. Such polishing damage can be evaluated in the same manner as the measurement of the etch pit density described above. The pits appearing due to the polishing damage are formed in a shape linearly connected to the dislocations and the damage remaining portions in the AlN single crystal substrate 1. Therefore, it is preferable that the density be small. Specifically, it is preferable that the AlN single crystal substrate 1 have a crystal growth surface of 5 pits/mm² or less, which is preferably 2 pits/mm² or less. As a matter of course, it is necessary to suppress polishing scratches and the like as much as possible, and it is preferable that the number of polishing scratches is 0 pits/substrate.

It is preferable that the AlN single crystal substrate 1 have high transparency to light emitted by a light-emitting element to be finally formed. Therefore, it is preferable that the absorption coefficient in the ultraviolet range, specifically, in wavelengths of 210 nm or more be 25 cm$^{-1}$ or less. The lower limit of the absorption coefficient is preferably as low as possible. In particular, in consideration of industrial production of the AlN single crystal substrate 1, measuring accuracy, and the like, the lower limit value of the absorption coefficient at 210 nm is 15 cm$^{-1}$, and the lower limit value of the absorption coefficient at the wavelengths of 250 nm or more is 5 cm$^{-1}$. Use of the AlN single crystal substrate having such a low absorption coefficient can suppress a decrease in output due to ultraviolet light absorption in the AlN single crystal substrate. Further, it is possible to suppress a decrease in output due to heat generated by absorbing ultraviolet light.

The thickness and size of the AlN single crystal substrate 1 used in the present invention are not particularly limited. If the thickness of the AlN single crystal substrate is small, the amount of light absorption in the substrate can be reduced even when the absorption coefficient is high. However, if the thickness is too thin, the handling of the substrate is difficult and the yield of the light-emitting element may be lowered. Therefore, it is usually preferable that the thickness be 50 to 1000 μm. When the n-type $Al_XGa_{1-X}N$ ($0.5 \leq X < 1$) layer 2 is grown on the AlN single crystal substrate 1, the larger the size of the AlN single crystal substrate 1 (the area of the crystal growth surface) becomes, the more the number of the light-emitting elements (chips) finally obtained can be increased. However, in consideration of industrial production of the light-emitting element, the size of the AlN single crystal substrate is preferably 0.5 to 6 inches in diameter. As a matter of course, for example, when a light-emitting element (chip) is made, the size of the AlN single crystal substrate portion used in the light-emitting element (chip) is reduced. Therefore, the size of the AlN single crystal substrate portion of the light-emitting element (chip) may be set to a size corresponding to the intended use purpose of the light-emitting element (chip). Usually, in the case of light-emitting elements (chips), the size of the AlN single crystal substrate portion is 0.01 to 10 mm² in area.

The AlN single crystal substrate 1 as described above can be fabricated by, for example, the sublimation method or the hydride vapor-phase epitaxial method described in a literature of J. Cryst. Growth 312, 58 to 63 (2009) and a literature of Appl. Phys. Express 5, 055504 (2011). Among these, when the group III nitride stacked body of the present invention is applied to a light-emitting element, it is preferable to fabricate the group III nitride stacked body by the hydride vapor-phase epitaxial method because it has a higher transmittance in the ultraviolet region.

(N-Type $Al_XGa_{1-X}N$ Layer ($0.5 \leq X < 1$))

In the present invention, the n-type $Al_XGa_{1-X}N$ ($0.5 \leq X < 1$) layer 2 is a single crystal layer stacked on the AlN single crystal substrate 1. The n-type $Al_XGa_{1-X}N$ ($0.5 \leq X < 1$) layer 2 formed on the AlN single crystal substrate 1 is lattice-matched to the AlN single crystal substrate 1. Therefore, all the layers constituting the n-type $Al_XGa_{1-X}N$ layer 2 including the first n-type $Al_{X1}Ga_{1-X1}N$ ($0.5 \leq X1 < 1$) layer 3, the second n-type $Al_{X2}Ga_{1-X2}N$ ($0.5 \leq X2 < 1$) layer 4, and the third n-type $Al_{X3}Ga_{1-X3}N$ ($0.5 \leq X3 < 1$) layer 5 are single crystal layers and lattice-matched to the AlN single crystal substrate 1.

Here, the "lattice matched state" means that the AlN single crystal substrate 1 and the n-type $Al_XGa_{1-X}N$ ($0.5 \leq X < 1$) layer 2 have substantially the same lattice constants in a direction parallel to the principal surface of the AlN single crystal substrate 1 and the n-type $Al_XGa_{1-X}N$ ($0.5 \leq X < 1$) layer 2. In other words, in the present invention, the lattice-matched n-type $Al_XGa_{1-X}N$ ($0.5 \leq X < 1$) layer 2 means that the lattice relaxation rate is 5% or less. The lower limit value of the lattice relaxation rate is 0, which means that the lattice constants of the n-type $Al_XGa_{1-X}N$ ($0.5 \leq X < 1$) layer 2 and the AlN single crystal substrate 1 coincide with each other. The lattice relaxation rate can be measured by X-ray reciprocal lattice mapping measurement.

The Al composition can be determined by X-ray diffractometry (XRD) or energy-dispersive X-ray spectroscopy (TEM-EDX). In the present invention, Al compositions determined by TEM-EDX were used.

In the present invention, since the n-type $Al_XGa_{1-X}N$ ($0.5 \leq X < 1$) layer 2 is a single crystal layer and is lattice-matched to the AlN single crystal substrate 1, lattice relaxation of the n-type $Al_XGa_{1-X}N$ ($0.5 \leq X < 1$) layer 2 accompanied by generation of dislocation does not occur. Therefore, the dislocation density in the n-type $Al_XGa_{1-X}N$ ($0.5 \leq X < 1$) layer 2 is equivalent to the dislocation density on the surface of the AlN single crystal substrate 1. Therefore, the dislocation density of the n-type $Al_XGa_{1-X}N$ ($0.5 \leq X < 1$) layer 2 is preferably $10^6$ cm$^{-2}$ or less as in the case of the AlN single crystal substrate 1, and more preferably $10^4$ cm$^{-2}$ or less. Although the n-type $Al_XGa_{1-X}N$ ($0.5 \leq X < 1$) layer 2 of the present invention is formed from a plurality of layers, the dislocation densities of the respective layers do not change because all of these layers are lattice-matched.

Figure 2:
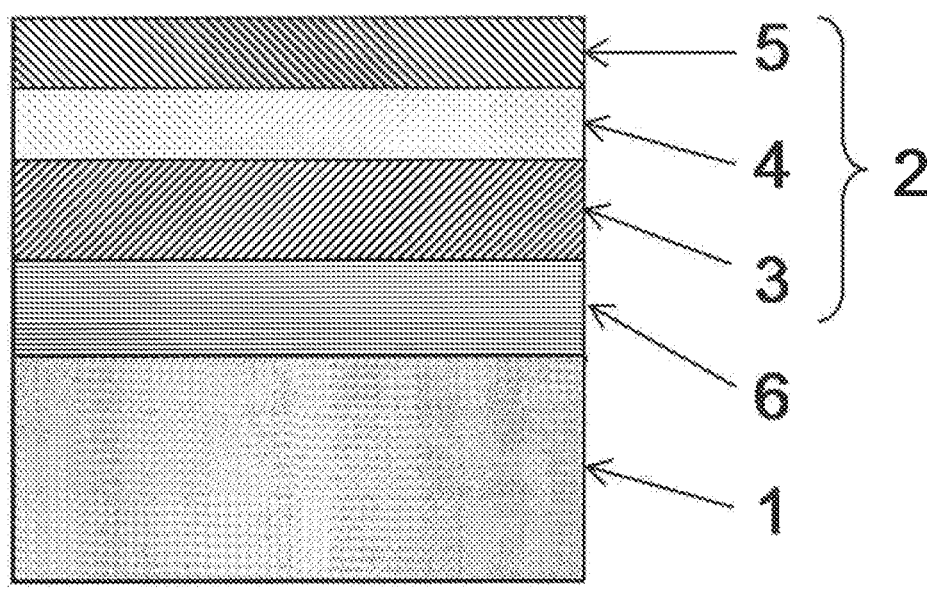
FIG. 2 is a schematic view (schematic cross-sectional view) of another example showing a structure of a group III nitride stacked body of the present invention.

The n-type $Al_XGa_{1-X}N$ ($0.5 \leq X < 1$) layer 2 may be directly stacked on the AlN single crystal substrate 1, or may be stacked via an intermediate layer 6 such as a single crystal AlN layer or an $Al_YGa_{1-Y}N$ ($0.5 \leq Y < 1$) layer as illustrated in FIG. 2. The thickness of the intermediate layer 6 is not particularly limited as long as the n-type $Al_XGa_{1-X}N$ (0.5≤X<1) layer 2 can maintain lattice-matching with the AlN single crystal substrate 1. Usually, from the viewpoint of industrial productivity and the like, the thickness is preferably 10 to 1000 nm. The intermediate layer 6 will be described in detail below.

In the present invention, the n-type $Al_XGa_{1-X}N$ (0.5≤X<1) layer 2 has at least a stacked structure in which the first n-type $Al_{X1}Ga_{1-X1}N$ (0.5≤X1<1) layer 3, the second n-type $Al_{X2}Ga_{1-X2}N$ (0.5≤X2<1) layer 4, and the third n-type $Al_{X3}Ga_{1-X3}N$ (0.5≤X<1) layer 5 are stacked in this order from the AlN single crystal substrate side. Then, X1, X2, and X3 representing the Al compositions of the respective layers in the n-type $Al_XGa_{1-X}N$ (0.5≤X<1) layer 2 satisfy 0<|X1−X2|≤0.1, and also satisfy 0<|X2−X3|≤0.1.

In the present invention, the n-type $Al_XGa_{1-X}N$ (0.5≤X<1) layer 2 only has to have at least a stacked structure in which the first n-type $Al_{X1}Ga_{1-X1}N$ (0.5≤X1<1) layer 3, the second n-type $Al_{X2}Ga_{1-X2}N$ (0.5≤X2<1) layer 4, and the third n-type $Al_{X3}Ga_{1-X3}N$ (0.5≤X3<1) layer 5 are directly stacked in this order. In the present invention, the reason why an excellent effect is exhibited by adopting such a stacked structure is presumed as follows. That is, as in the present invention, providing differences in Al compositions at the respective interfaces of the first, second, and third n-type $Al_XGa_{1-X}N$ (0.5≤X<1) layers forms triangular potentials at the interfaces. As a result, a high electron density layer (a two-dimensional electron gas layer) in which electrons are accumulated at the interface is formed. As a result, it is presumed that the conductivity of the n-type $Al_XGa_{1-X}N$ (0.5≤X<1) layer in the horizontal direction is improved by the electron conduction via the high electron density layer.

In consideration of the mechanism of such an effect, it is considered that the effect of the present invention is exhibited if the first, second, and third n-type $Al_XGa_{1-X}N$ (0.5≤X<1) layers are directly stacked. Therefore, although not shown in FIGS. 1 and 2, an n-type layer composed of another AlGaN may be provided in the lower layer of the first n-type $Al_{X1}Ga_{1-X1}N$ (0.5≤X1<1) layer 3 and in the upper layer of the third n-type $Al_{X3}Ga_{1-X3}N$ (0.5≤X3<1) layer 5 in the present invention. When an n-type layer is formed in the lower layer of the first n-type $Al_{X1}Ga_{1-X1}N$ (0.5≤X1<1) layer 3, it can also serve as the intermediate layer 6, which will be described in detail below. However, in consideration of the productivity of the group III nitride stacked body, it is preferable that the n-type $Al_XGa_{1-X}N$ (0.5≤X<1) layer 2 is composed of the first n-type $Al_{X1}Ga_{1-X1}N$ (0.5≤X1<1) layer 3, the second n-type $Al_{X2}Ga_{1-X2}N$ (0.5≤X2<1) layer 4, and the third n-type $Al_{X3}Ga_{1-X3}N$ (0.5≤X3<1) layer 5.

Figure 3:
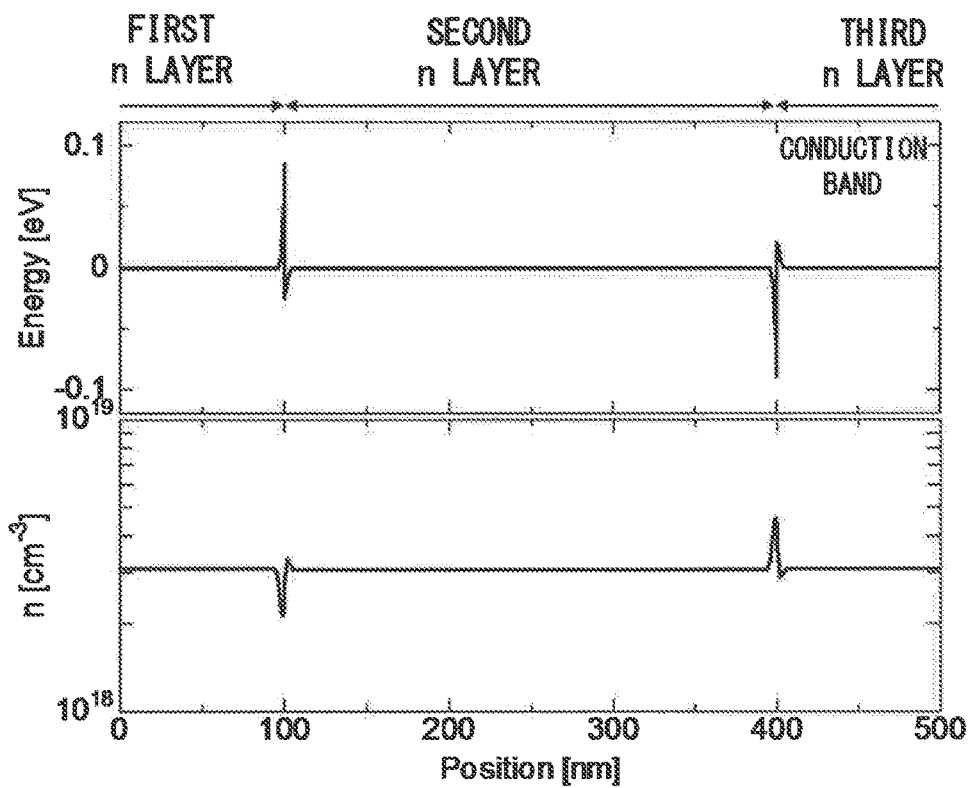
FIG. 3 is a graph showing an energy band and an electron density profile of the group III nitride stacked body of the present invention (which corresponds to Example 1).
Figure 4:
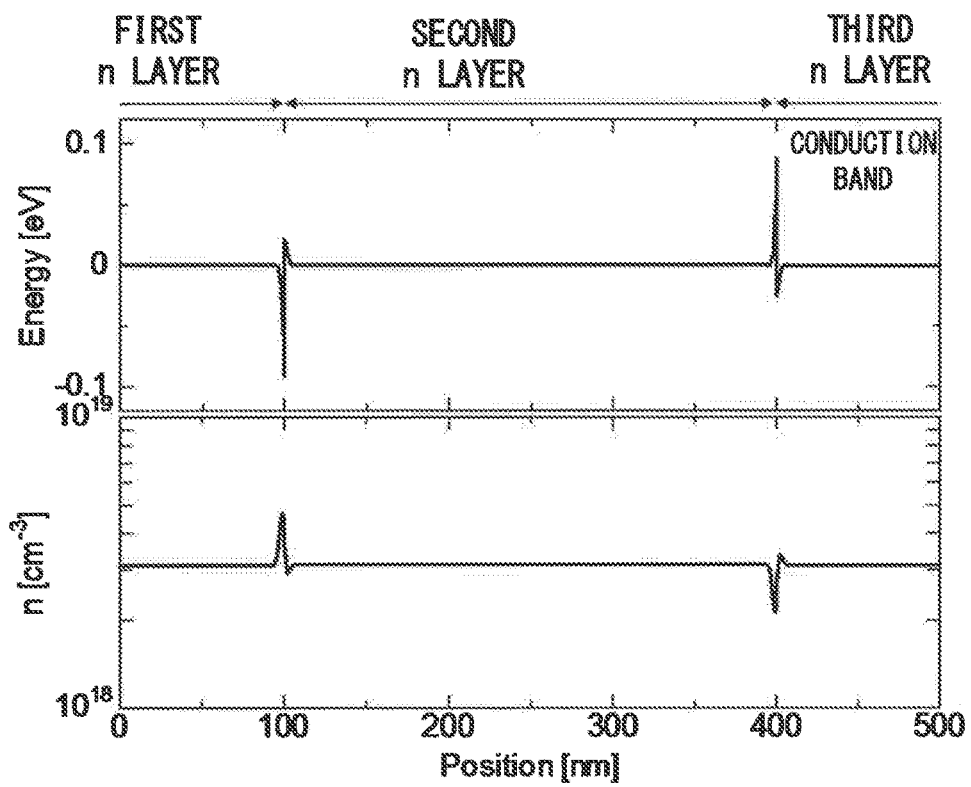
FIG. 4 is a graph showing an energy band and an electron density profile of the group III nitride stacked body of the present invention (which corresponds to Example 2).

FIGS. 3 and 4 illustrate the energy band and electron density profiles of the n-type $Al_XGa_{1-X}N$ (0.5≤X<1) layer in the group III nitride stacked body of the present invention.

The differences in Al compositions at the interfaces of the first, second, and third n-type $Al_XGa_{1-X}N$ (0.5≤X<1) layers, i.e., |X1−X2| and |X2−X3|, exceed 0 and are 0.1 or less. If this value exceeds 0.1, the effect of accumulating electrons at the interface increases, but on the other hand, the resistance value in the film thickness direction increases because the barrier in the film thickness direction increases. As a result, the conductive paths of the n-type $Al_XGa_{1-X}N$ (0.5≤X<1) layer 2 in the horizontal direction are limited to only the interface, and the resistance value may increase, which is not preferable. When the difference in composition is 0, the effect of the present invention is not exhibited. In consideration of the effects of accumulation of electrons at the interface, it is preferable to satisfy 0.02≤|X1−X2|≤0.1 and 0.02≤|X2−X3|≤0.1, and further preferably to satisfy 0.03≤|X1−X2|≤0.1 and 0.03≤|X2−X3|≤0.1.

In the n-type $Al_XGa_{1-X}N$ (0.5≤X<1) layer 2, the relationship among the Al compositions of the first, second, and third n-type $Al_XGa_{1-X}N$ layers is preferably such that the X1, X2, and X3 satisfy X1<X2 and X3<X2, or satisfy X2<X1 and X2<X3. In this case, the Al composition (X2) of the second n-type $Al_{X2}Ga_{1-X2}N$ (0.5≤X2<1) layer 4 located at the intermediate position is higher or lower than the Al compositions of the other two layers.

As another preferable Al composition relationship, it is preferable to satisfy X1<X2<X3. This means that the Al compositions are gradually increased in the stacked structure in which the first, second, and third n-type $Al_XGa_{1-X}N$ layers are stacked.

When such a composition relationship is satisfied, a high electron density layer is formed at the interface between the first and second or second and third n-type layers, and good conductivity of the n-type $Al_XGa_{1-X}N$ (0.5≤X<1) layer 2 in the horizontal direction can be obtained.

Figure 5:
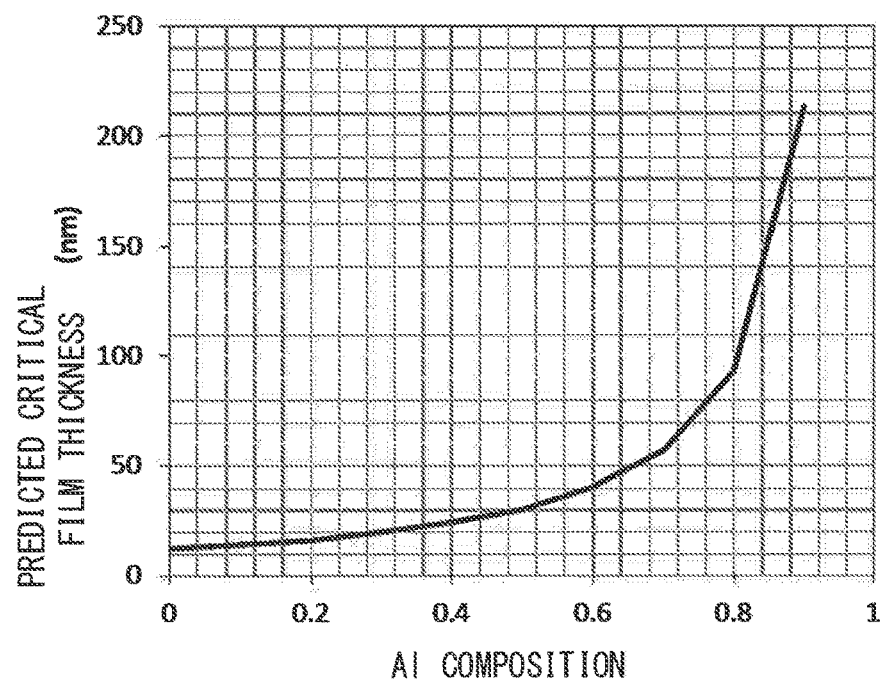
FIG. 5 is a diagram showing the predicted critical film thickness of the AlGaN layer formed on the AlN substrate according to the MB theory.

The film thickness of each layer of the first, second, and third n-type $Al_XGa_{1-X}N$ (0.5≤X<1) layers is preferably 1 time or more and less than 5 times the predicted critical film thickness (see FIG. 5) based on the MB theory.

If the thickness of each layer is less than 5 times the predicted critical film thickness based on the MB theory, the relaxation of the n-type $Al_XGa_{1-X}N$ (0.5≤X<1) layer 2 can be suppressed, that is, the risk of dislocation occurring in the n-type $Al_XGa_{1-X}N$ (0.5≤X<1) layer 2 can be reduced. Therefore, by setting the film thickness of each layer of the first, second, and third n-type $Al_XGa_{1-X}N$ (0.5≤X<1) layers to be 1 time or more and less than 5 times the predicted critical film thickness, it becomes easy to obtain a single crystal layer lattice-matched to the AlN single crystal in the entire n-type $Al_XGa_{1-X}N$ (0.5≤X<1) layer 2.

The lower limit value of the film thickness of each layer is preferably 1 time the predicted critical film thickness based on the MB theory. Since the film thickness of each layer is approximately several tens of nanometers when it is less than 1 time the predicted critical film thickness, manufacturing processes tend to be complicated in order to obtain, for example, a total film thickness for ensuring sufficient conductivity of the n-type $Al_XGa_{1-X}N$ (0.5≤X<1) layer in the ultraviolet light-emitting element.

Therefore, the film thickness of each layer of the first, second, and third n-type $Al_XGa_{1-X}N$ (0.5≤X<1) layers is preferably 2 times or more and less than 5 times, more preferably 3 times or more and less than 5 times, and particularly preferably 3 times or more and 4.9 times or less, the predicted critical film thickness based on the MB theory in consideration of the controllability of the film thickness and the reproducibility of processes.

The total thickness of the n-type $Al_XGa_{1-X}N$ (0.5≤X<1) layer 2 is 500 nm or more. It should be understood that the total thickness of the n-type $Al_XGa_{1-X}N$ (0.5≤X<1) layer 2 is the total thickness of all of the n-type layers including the first n-type $Al_{X1}Ga_{1-X1}N$ (0.5≤X1<1) layer 3, the second n-type $Al_{X2}Ga_{1-X2}N$ (0.5≤X2<1) layer 4, and the third n-type $Al_{X3}Ga_{1-X3}N$ (0.5≤X3<1) layer 5, and, as necessary, n-type layers formed in the lower layer of the first n-type $Al_{X1}Ga_{1-X1}N$ (0.5≤X1<1) layer 3 and in the upper layer of the third n-type $Al_{X3}Ga_{1-X3}N$ (0.5≤X<1) layer 5. In consideration of the improvement in conductivity in the horizontal direction, the total thickness is preferably 700 nm or more. When the total thickness is 500 nm or more, the film has a sufficient thickness, so that a decrease in conductivity in the horizontal direction can be suppressed. The upper limit of the total thickness of the n-type $Al_XGa_{1-X}N$ (0.5≤X<1) layers is not particularly limited, but is 3000 nm from the viewpoint of productivity and lattice matching with AlN single crystal substrates.

In the present invention, it is preferable that the n-type $Al_XGa_{1-X}N$ (0.5≤X<1) layer 2 be doped with Si as an n-type dopant. The concentration of the dopant is not particularly limited, and may be appropriately determined depending on the intended purpose. In particular, in order to realize high conductivity, the Si concentration is preferably $1\times10^{18}$ cm$^{-3}$ to $5\times10^{19}$ cm$^{-3}$. As described above, although the n-type $Al_XGa_{1-X}N$ (0.5≤X<1) layer 2 is composed of a plurality of layers, it is preferable that the concentration of Si in each layer be $1\times10^{18}$ cm$^{-3}$ to $5\times10^{19}$ cm$^{-3}$. The Si concentration of each layer may be constant, the Si concentration of each layer may be changed according to the device design or the like, or the Si concentration at the interface of each layer may be increased.

The n-type $Al_XGa_{1-X}N$ (0.5≤X<1) layer 2 preferably has a low carbon impurity content. For example, when a large amount of carbon is mixed into the n-type $Al_XGa_{1-X}N$ (0.5≤X<1) layer 2, the conductivity or transparency may be deteriorated. Thus, the carbon concentration in the n-type $Al_XGa_{1-X}N$ (0.5≤X<1) layer 2 is preferably $10^{17}$ cm$^{-3}$ or less, and further preferably $5\times10^{16}$ cm$^{-3}$ or less.

In the present invention, it is preferable that the uppermost surface of the n-type $Al_XGa_{1-X}N$ (0.5≤X<1) layer 2 and the interface between the layers whose Al compositions change be smooth. In particular, since the interface of each layer is smooth in the n-type $Al_XGa_{1-X}N$ (0.5≤X<1) layer, an unintentional increase in the impurity content at the interface can be prevented. More specifically, the root-mean-square roughness (RMS) of the uppermost surface and the respective interfaces in the 5×5 µm² area is preferably 10 nm or less, more preferably 5 nm or less, and further preferably 1 nm or less. The lower limit value of RMS is preferably 0 nm, but is 0.05 nm by the current technology in consideration of industrial production.

Although hillocks of several micrometers may be formed on the outermost surface of the n-type $Al_XGa_{1-X}N$ (0.5≤X<1) layer 2, such hillocks may cause degradation of the characteristics of the semiconductor devices of the present invention. Therefore, the hillock density of the surface is preferably 10 pieces/mm², more preferably 5 pieces/mm², and further preferably 1 pieces/mm² or less. These hillocks can be controlled by the growth method of the n-type $Al_XGa_{1-X}N$ (0.5≤X<1) layer 2. In the present invention, the hillock density can be measured by surface observation using a Nomarski microscope.

(Growth Method of N-Type $Al_XGa_{1-X}N$ (0.5≤X<1) Layer)

In the present invention, the n-type $Al_XGa_{1-X}N$ (0.5≤X<1) layer 2 described above can be manufactured on an AlN single crystal substrate by a known crystal growth method such as a metal-organic chemical vapor deposition (MOCVD) method or a molecular beam epitaxy (MBE) method. Among these, an MOCVD method having high productivity and industrially used widely is preferable. The n-type $Al_XGa_{1-X}N$ (0.5≤X<1) layer 2 formed by the MOCVD method can be manufactured, for example, with reference to the conditions described in International Publication (WO2012/056928).

As the group III source gas, the group V source gas, and the dopant source gas used in the MOCVD method, known materials that can be used for forming the n-type $Al_XGa_{1-X}N$ (0.5≤X<1) layer 2 can be used without any particular limitation.

For example, as the group III source gas, it is preferable to use a gas such as trimethylaluminum, triethylaluminum, trimethylgallium, triethylgallium, or the like. As the group V source gas, ammonia is preferably used. As the n-type doping source gas, a silane-based gas such as monosilane or tetraethylsilane is preferably used. As the n-type doping source gas, the group III source gas and the group V source gas only have to be supplied simultaneously.

The above-described source gas is supplied to a reactor together with a carrier gas such as hydrogen and/or nitrogen to grow the n-type $Al_XGa_{1-X}N$ (0.5≤X<1) layer 2 on the AlN single crystal substrate 1. The preferable range of the molar ratio (V/III ratio) of the group V source gas and the group III source gas is not particularly limited, but is preferably set within the range of 500 to 10000. The V/III ratio only has to be appropriately determined within the above-mentioned set range.

The growth temperatures and the growth pressures of the n-type $Al_XGa_{1-X}N$ (0.5≤X<1) layer 2 are not particularly limited, but are preferably in the range of 1000 to 1300° C. and in the range of 30 to 1000 mbar, respectively, and more preferably in the range of 1030 to 1130° C. and in the range of 30 to 500 mbar, respectively.

In the n-type $Al_XGa_{1-X}N$ (0.5≤X<1) layer 2, when the composition of each layer is changed, the ratio of the group III source gas to be supplied, for example, the supply ratio of trimethylaluminum and trimethylgallium only has to be changed, whereby a plurality of layers having different Al composition (X) values can be stacked. In order to form a stacked structure in which the first n-type $Al_{X1}Ga_{1-X1}N$ (0.5≤X1<1) layer 3, the second n-type $Al_{X2}Ga_{1-X2}N$ (0.5≤X2<1) layer 4, and the third n-type $Al_{X3}Ga_{1-X3}N$ (0.5≤X3<1) layer 5 are directly stacked in this order, a group III source gas only has to be supplied so as to satisfy the Al compositions (X1, X2, and X3) of the respective layers. When the Si concentration is changed in each layer, a layer having a different Si concentration can be fabricated by changing the supply ratio of the n-type doping source gas to the group III source gas.

The n-type $Al_XGa_{1-X}N$ (0.5≤X<1) layer 2 stacked on the AlN single crystal layer 1 has been described above (the group III nitride stacked body of the present invention and the manufacturing method thereof have been described). Next, a preferred example of a (ultraviolet) light-emitting element (semiconductor device) having the structure of the group III nitride stacked body will be described.

(Light-Emitting Element with Preferred Structure: Semiconductor Device)

Figure 6:
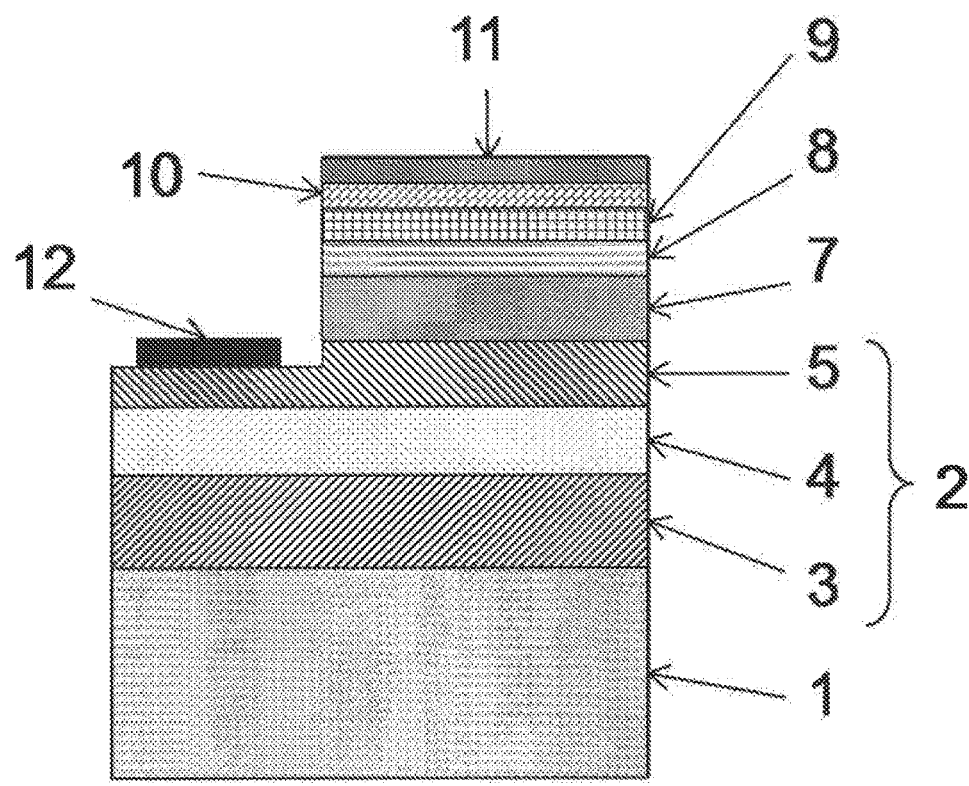
FIG. 6 is a schematic view (schematic cross-sectional view) showing an example of a structure of an ultraviolet light-emitting element including the group III nitride stacked body of the present invention.

When an ultraviolet light-emitting element including the group III nitride stacked body of the present invention is manufactured, it is preferable to fabricate a stacked structure composed of a plurality of $Al_ZGa_{1-Z}N$ (0≤Z≤1) layers in which the active layer 7 and the p-type layer 9 are stacked in this order on the group III nitride stacked body of the present invention (see FIG. 6). As illustrated in FIG. 2, the intermediate layer 6 formed of a single crystal may be provided between the AlN single crystal substrate 1 and the n-type $Al_XGa_{1-X}N$ (0.5≤X<1) layer 2. Next, a semiconductor device will be described with reference to FIG. 6.

The active layer 7 and the p-type layer 9 described above may be a single layer, but each may be a plurality of layers, for example, layers having different Al compositions or layers having different dopant concentrations. For example, the electron-blocking layer 8 having a high Al composition can be formed between the active layer 7 and the p-type layer 9. The electron-blocking layer 8 may be the p-type layer 9. A contact layer 10 formed of p-type GaN may also be provided on the p-type layer 9 in order to improve the contact characteristics with the electrode. These layers will be described.

(Intermediate Layer 6)

The intermediate layer 6 is directly stacked on the AlN single crystal substrate 1, and is formed of a single crystal AlN layer or an $Al_YGa_{1-Y}N$ (0.5≤Y<1) layer, and can be used for the intended purpose of reducing the hillock density on the surface of the n-type $Al_XGa_{1-X}N$ (0.5≤X<1) layer 2, suppressing the occurrence of lattice relaxation of the n-type $Al_XGa_{1-X}N$ (0.5≤X<1) layer 2, or the like. The intermediate layer 6 may be an undoped layer containing no impurities or a doped layer containing impurities such as Si or Mg within a range in which the crystalline quality of the n-type $Al_XGa_{1-X}N$ (0.5≤X<1) layer 2 is maintained. When such an intermediate layer 6 is provided, the thickness thereof is preferably 10 to 1000 nm. However, when Si is contained, the intermediate layer 6 can be regarded as a part of the n-type $Al_XGa_{1-X}N$ (0.5≤X<1) layer.

The intermediate layer 6 is preferably manufactured by the MOCVD method described in the growth method of the n-type $Al_XGa_{1-X}N$ (0.5≤X<1) layer 2. As other growth conditions, the range described in the growth method of the n-type $Al_XGa_{1-X}N$ (0.5≤X<1) layer 2 may be adopted. The intermediate layer 6 is not an essential layer, and is provided between the AlN single crystal substrate 1 and the n-type $Al_XGa_{1-X}N$ (0.5≤X<1) layer 2 as necessary.

<N-Type $Al_XGa_{1-X}N$ (0.5≤X<1) Layer 2>

When the n-type $Al_XGa_{1-X}N$ (0.5≤X<1) layer 2 is applied to an ultraviolet light-emitting element in the present invention, the configurations of the respective layers, the compositions (X1, X2, and X3), the film thicknesses of the respective layers, and the like may be determined in accordance with the wavelengths of the target ultraviolet light-emitting element within the range of the n-type $Al_XGa_{1-X}N$ (0.5≤X<1) layer 2 in the group III nitride stacked body which has been described. The details are as mentioned above.

<Active Layer 7>

The active layer 7 is stacked on the uppermost surface of the n-type $Al_XGa_{1-X}N$ (0.5≤X<1) layer 2. In the present invention, it is particularly preferable that the active layer 7 be formed on the third n-type $Al_{X3}Ga_{1-X3}N$ (0.5≤X3<1) layer 5. The active layer 7 is preferably an AlGaN layer lattice-matched to the AlN-single crystal substrate 1. For the active layer 7, a known structure such as a multiple quantum well layer in which a well layer and a barrier layer are stacked a plurality of times may be used without limitation. In addition, Si may be doped into the multiple quantum well layer. The compositions of the well layer and the barrier layer may be appropriately determined according to the intended use purpose. Specifically, the Al composition is preferably adjusted in the range of 0.1 to 0.8. The thicknesses of the well layer and the barrier layer are not particularly limited, and usually, the thickness of one well layer is 2 to 10 nm and the thickness of one barrier layer is 5 to 25 nm.

The active layer 7 is also preferably manufactured by the MOCVD method, and the growth conditions may be adjusted as appropriate by employing the range described in the growth method of the n-type $Al_XGa_{1-X}N$ (0.5≤X<1) layer so that the active layer 7 has a desired composition.

<Electron-Blocking Layer 8>

The electron-blocking layer 8 is an AlGaN layer stacked on the active layer 7. However, since the electron-blocking layer 8 may be p-type, it can also be regarded as a kind of the p-type layer 9. Since the electron-blocking layer 8 is desired to have a high band gap energy, it is preferable that the Al composition be higher than those of other layers. Therefore, when a light-emitting element having an emission wavelength shorter than 280 nm is particularly fabricated, it is most preferable to use an AlN layer. When the emission wavelength is longer than 280 nm, the Al composition may be appropriately determined within the range of 0.3 to 0.9. The thickness of the electron-blocking layer 8 is not particularly limited, but is 5 to 20 nm.

While the Mg concentration in the electron-blocking layer 8 is not particularly limited, the Mg concentration is preferably $3 \times 10^{19}$ to $2 \times 10^{20}$ cm$^{-3}$, and more preferably $5 \times 10^{19}$ to $1 \times 10^{20}$ cm$^{-3}$.

Preferably, the electron-blocking layer 8 is also manufactured by the MOCVD method. The growth conditions may be adjusted as appropriate by employing the range described in the growth method of the n-type $Al_XGa_{1-X}N$ (0.5≤X<1) layer 2 so that the electron-blocking layer 8 has a desired composition. When Mg is doped, a known Mg dopant gas may be used instead of the Si dopant gas.

<P-Type Layer 9>

The p-type layer 9 is a p-type AlGaN layer formed on the electron-blocking layer 8. The p-type layer 9 may be formed from a plurality of layers, but may also be stacked on the active layer 7 because it provides the same function as the electron-blocking layer 8 if there is a layer whose Al composition is higher than those of the other layers. The composition of the p-type layer 9 may be appropriately determined depending on the intended use purpose, and in particular, when a light-emitting element having an emission wavelength shorter than 280 nm is to be fabricated, the Al composition is preferably adjusted in the range of 0.7 to 1.0. The thickness of the p-type layer 9 is not particularly limited, and is usually about 5 to 100 nm. Further, the Mg concentration in the p-type layer 9 is not particularly limited similarly to the electron-blocking layer 8, but the Mg concentration is preferably $3 \times 10^{19}$ to $2 \times 10^{20}$ cm$^{-3}$, and more preferably $5 \times 10^{19}$ to $1 \times 10^{20}$ cm$^{-3}$.

The p-type layer 9 is also preferably manufactured by the MOCVD method, and the growth conditions may be adjusted as appropriate by employing the range described in the growth method of the n-type $Al_XGa_{1-X}N$ (0.5≤X<1) layer 2 so that the p-type layer 9 has a desired composition. It should be understood that a known Mg dopant gas is used instead of the Si dopant gas.

<Contact Layer (p-Type GaN Layer) 10>

A contact layer 10 may be provided on the p-type layer 9. The contact layer 10 is preferably a p-type GaN layer. By providing the contact layer 10, the contact resistance with the electrode electrically connected to the p-type layer 9 can be reduced as described above. The film thickness of the p-type GaN layer is not particularly limited, but may be appropriately determined in the range of 5 to 1000 nm. The Mg concentration in the p-type GaN layer is not particularly limited, but the Mg concentration in the p-type GaN layer is preferably $1 \times 10^{19}$ to $2 \times 10^{20}$ cm$^{-3}$, and more preferably $5 \times 10^{19}$ to $1 \times 10^{20}$ cm$^{-3}$.

The contact layer 10 is also preferably manufactured by the MOCVD method, and the other growth conditions may be adjusted as appropriate on the basis of the growth conditions described in Japanese Patent No. 5401145 so as to obtain desired characteristics. It should be understood that a known Mg dopant gas is used instead of the Si dopant gas.

<N-Type Electrode 12>

The n-type electrode 12 is formed on the n-type $Al_XGa_{1-X}N$ (0.5≤X<1) layer 2 exposed by etching or the like. Usually, the n-type electrode 12 is formed on the n-type Al$_X$Ga$_{1-X}$N (0.5≤X<1) layer 2 by the following method. Among these, it is preferable to form the n-type electrode 12 at a position where the distance in the depth direction between the n-type electrode 12 and the interface between the first and second, or second and third n-type Al$_X$Ga$_{1-X}$N (0.5≤X<1) layers is 10 nm or more and 150 nm or less, and more preferably 20 nm or more and 100 nm or less. This facilitates accessing the high-density electron layer from the n-electrode 12, and in addition to improving the conductivity of the n-type Al$_X$Ga$_{1-X}$N (0.5≤X<1) layer 2 in the horizontal direction, the contact resistance of the n-electrode 12 and the n-type Al$_X$Ga$_{1-X}$N (0.5≤X<1) layer 2 can be reduced.

For the n-type electrode 12, known n-type ohmic electrode materials and forming methods may be used. Specifically, there is no particular limitation imposed thereon as long as the material can reduce the contact resistance value with the n-type Al$_X$Ga$_{1-X}$N (0.5≤X<1) layer 2. Specifically, it is preferable to use the electrode material containing Ti and Al described in Japanese Patent Application Laid-Open No. 2011-547604.

These electrode materials can be formed by a vacuum evaporation method, a sputtering method, or the like. In order to reduce the contact resistance value, annealing is preferably performed in an inert gas atmosphere such as argon or nitrogen after the electrode layer is formed. The annealing temperature is not particularly limited, but is preferably 700 to 1100° C. The thickness of the n-type electrode (layer) 12 is not particularly limited, and the film thickness of each layer may be appropriately determined within a range in which the contact resistance value after annealing can be reduced, but the total thickness is preferably 50 to 500 nm in consideration of the productivity and the like of the electrode layer.

(P-Type Electrode 11)

As the p-type electrode (layer) 11, a known p-type ohmic electrode material can be used. Specifically, there is no particular limitation imposed thereon as long as the material can reduce the contact resistance value with the contact layer 10, and for example, an electrode material containing Ni and Au described in Japanese Patent No. 3499385 can be used.

These electrode materials can be formed by a vacuum evaporation method, a sputtering method, or the like. After the p-type electrode is formed, annealing treatment is preferably performed in an atmosphere of nitrogen, oxygen, or the like in order to reduce the contact resistance value. The annealing temperature is not particularly limited, but is generally about 400 to 700° C. Although not particularly limited, the thickness of the p-electrode 11 is preferably 5 to 300 nm.

(Characteristics of Light-Emitting Element; Characteristics of Semiconductor Device)

The semiconductor device of the present invention can be an ultraviolet light-emitting element having an emission peak wavelength of 210 to 350 nm by preparing the compositions and the like of the respective layers. An ultraviolet light-emitting element having an emission peak wavelength in this range must have a configuration in which the Al composition is relatively high. Therefore, the group III nitride stacked body of the present invention can be suitably applied thereto.

EXAMPLES

Hereinafter, the present invention will be described in detail using an example in which the present invention is applied to a light-emitting diode having a structure illustrated in FIG. 6 and having an emission wavelength band of 260 nm, but the present invention is not limited to the following examples.

Example 1

(Preparation of AlN Single Crystal Substrate 1)

An AlN single crystal substrate was fabricated by the method described in Applied Physics Express 5 (2012) 122101. Specifically, a C-plane AlN seed substrate having a diameter of 25 mm fabricated by a PVT method was first prepared. The AlN seed substrate has an off-angle of 0.05 to 0.5° and a dislocation density of $10^4$ cm$^{-2}$ or less. Further, when X-ray rocking curves of the (002) and (101) planes were measured under the condition of an acceleration voltage of 45 kV and an acceleration current of 40 mA by a high-resolution X-ray diffractometer (X'Pert manufactured by the PANalytical Division of Spectris), the full width at half maximum of the X-ray rocking curve was 30 arcsec or less.

Next, an AlN thick film (hereinafter referred to as an AlN thick film by the HVPE method) with a thickness of 300 µm was formed on the AlN seed substrate by the HVPE method. After that, chemical mechanical polishing (CMP) was performed on the AlN thick film grown surface thereof. It was confirmed that the full width at half maximum of the X-ray rocking curve of the AlN thick film by the HVPE method after CMP-polishing was 30 arcsec or less equivalent to that of the AlN seed substrate, and the dislocation density of the AlN thick film by the HVPE method was also confirmed to maintain a crystal quality of $10^4$ cm$^{-2}$ or less as in the case of the AlN seed substrate.

The off-angle of the AlN thick film by the HVPE method after CMP-polishing was controlled to be 0.2 to 0.5°. The surface roughness (RMS) of the crystal growth surface (polished surface of the AlN thick film by the HVPE method) of the growth substrate (substrate in which the AlN thick film by the HVPE method was stacked on the AlN seed substrate) fabricated in this manner was 0.1 nm or less in the range of 5×5 µm$^2$, and the etch pit density confirmed by a Nomarski microscope after immersion in an acid mixed solution (sulfuric acid:phosphoric acid=1:3) at 190° C. for 10 minutes was 4×10$^4$/cm$^2$.

Further, as a result of measuring the transmittance of the AlN thick film by the HVPE method fabricated in the same manner, it was confirmed that the linear transmittance of 260 nm was 60% or more and the absorbing coefficient in the same wavelength range was 10 cm$^{-1}$ or less. As will be described in detail below, the AlN seed substrate portion is finally removed from the growth substrate when the ultraviolet light-emitting element is fabricated. Therefore, the AlN single crystal substrate in the present invention corresponds to the AlN thick film portion by the HVPE method.

A light-emitting element (semiconductor device) having the structure shown in FIG. 6 was fabricated using the growth substrate (AlN single crystal substrate) fabricated as described above. First, a growth substrate was placed on a susceptor in an MOCVD apparatus, and the substrate was heated to 1200° C. while a mixed gas of hydrogen and nitrogen was caused to flow at a total flow rate of 13 slm to clean the crystal growth surface.

(Formation of N-Type Al$_X$Ga$_{1-X}$N (0.5≤X<1) Layer 2)
(Formation of First N-Type Al$_{X1}$Ga$_{1-X1}$N (0.5≤X1<1) Layer 3)

Next, an n-type Al$_{0.7}$Ga$_{0.3}$N layer (first n-type AlGaN layer 3, X1=0.70) was formed to have a thickness of 250 nm (4.4 times the expected critical film thickness) under the following conditions: the substrate temperature was 1050° C.; the flow rate of trimethylaluminum was 35 µmol/min; the flow rate of trimethylgallium was 18 µmol/min; the flow rate of tetraethylsilane was 0.02 µmol/min; and the flow rate of ammonia was 1.5 slm.

(Formation of Second N-Type $Al_{X2}Ga_{1-X2}N$ (0.5≤X2<1) Layer 4)

Next, an n-type $Al_{0.66}Ga_{0.34}N$ layer (second n-type AlGaN layer 4, X2=0.66) was formed to have a thickness of 200 nm (4.0 times the expected critical film thickness) under the same conditions as those for the first n-type AlGaN layer except that the flow rate of trimethylgallium was 22 µmol/min.

(Formation of Third N-Type $Al_{X2}Ga_{1-X2}N$ (0.5≤X2<1) Layer 5)

Next, an n-type $Al_{0.73}Ga_{0.27}N$ layer (third n-type AlGaN layer 5, X3=0.73) was formed to have a thickness of 250 nm (3.7 times the expected critical film thickness) under the same conditions as those for the first n-type AlGaN layer except that the flow rate of trimethylgallium was 16 µmol/min.

(Formation of Active Layer 7)

Next, a barrier layer was formed to have a thickness of 10 nm under the same conditions as those for the n-type $Al_{0.7}Ga_{0.3}N$ layer except that the flow rate of tetraethylsilane was 0.002 µmol/min. Next, an $Al_{0.5}Ga_{0.5}N$ well layer was formed to have a thickness of 3 nm under the same conditions as those for the barrier layer except that the flow rate of trimethylgallium was 40 µmol/min, the flow rate of trimethylaluminum was 3 µmol/min, and the flow rate of tetraethylsilane was 0 µmol/min. By repeating the growth of the well layer and the barrier layer three times, a triple quantum well layer (active layer 7) was formed.

(Electron-Blocking Layer 8)

Next, a p-type AlN layer 8 (electron-blocking layer 8) was formed to have a thickness of 20 nm under the same conditions as those for the first n-type AlGaN layer 3 except that the supply of trimethylgallium and tetraethylsilane was stopped, and bicyclopentadienylmagnesium was supplied at 1.0 µmol/min.

(p-Type Layer 9)

Next, a p-type $Al_{0.9}Ga_{0.2}N$ layer 9 (p-type layer 9) was formed to have a thickness of 50 nm under the same conditions as those for the p-type AlN layer 8 (electron-blocking layer 8) except that the flow rate of trimethylgallium supplied was 8 µmol/min.

(Contact Layer 10)

Next, a contact layer 10 (p-type GaN layer 10) was formed to have a thickness of 300 nm under the conditions such that, after the substrate temperature was changed to 1030° C. and the pressure was changed to 200 mbar, the flow rate of trimethylgallium was 0.2 µmol/min, the flow rate of ammonia was 3.0 slm, the flow rate of bicyclopentadienylmagnesium was 1.0 µmol/min, and the flow rate of a carrier gas was 7 slm.

(Confirmation of Physical Properties of Group III Nitride Stacked Body)

Further, the crystal qualities of the respective layers (n-type $Al_XGa_{1-X}N$ layer to p-type GaN layer) fabricated as described above were evaluated by a high-resolution X-ray diffractometer in the same manner as that for the AlN single crystal substrate. As a result of XRD-reciprocal lattice mapping measurements on the (114) plane for evaluating the states of lattice relaxation of the respective layers, it was confirmed that the lattice relaxation rates of the respective layers of the n-type $Al_XGa_{1-X}N$ layer (0.5≤X<1) were all 0.5% or less and lattice-matched with the AlN single crystal substrates. In other words, it was confirmed that all the layers in the n-type $Al_XGa_{1-X}N$ layer 2 were lattice-matched.

(Formation of N-Electrode 12)

Next, a part of the substrate was etched by an ICP-etching apparatus until the n-type $Al_{0.73}Ga_{0.27}N$ layer (third n-type AlGaN layer 5) was exposed. The remaining thickness of the n-type $Al_{0.73}Ga_{0.27}N$ layer 5 (third n-type AlGaN layer 5) confirmed by measuring the step after the etching was 50 nm. Next, a Ti (20 nm)/Al (100 nm)/Ti (20 nm)/Au (50 nm) electrode 12 was formed on the exposed surface by a vacuum evaporation method, and heat treatment was performed in a nitrogen atmosphere for 1 minute at 900° C.

(Formation of P-Electrode 11)

Next, a Ni (20 nm)/Au (100 nm) electrode 11 was formed on the contact layer 10 (p-type GaN layer 10) by a vacuum evaporation method, and heat treatment was performed in an oxygen atmosphere for 5 minutes at 500° C.

(Semiconductor Device; Fabrication of Ultraviolet Light-Emitting Element)

Next, the AlN seed substrate portion was removed by mechanical polishing until the AlN thick film portion by the HVPE method was exposed, thereby completing the ultraviolet light-emitting element (wafer) (in this case, the AlN thick film portion by the HVPE method corresponds to the AlN single crystal substrate 1). At this time, the thickness of the AlN thick film portion by the HVPE method (the AlN single crystal substrate 1) was 100 µm. As a result of measuring the current and voltage between the p-type and n-type electrodes of each device (each device size was 1×1 mm, 300 pieces/1 wafer) of the fabricated ultraviolet light-emitting element (wafer), the average driving voltage at the driving current of 400 mA was 7.9 V.

Next, after the respective devices were cut into a plurality of 1×1 mm chip shapes by dicing, they each are flip-chip bonded on a ceramic mount to complete a light-emitting diode. The emission wavelength of the fabricated light-emitting diode was 264 nm, and the light emission output at a driving current of 400 mA was 52 mW. The results are summarized in Table 1.

Example 2

A semiconductor device (ultraviolet light-emitting element) was fabricated in the same manner as in Example 1 except that, in the second n-type $Al_{X2}Ga_{1-X2}N$ (0.5≤X2<1) layer 4 of Example 1, the flow rate of trimethylgallium was changed to 8 µmol/min, and an n-type $Al_{0.8}Ga_{0.2}N$ layer (second n-type AlGaN layer 4, X2=0.8) was formed to have a thickness of 200 nm (2.2 times the expected critical film thickness). As a result of XRD-reciprocal lattice mapping measurements on the (114) plane in confirming the physical properties of the group III nitride stacked body, the lattice relaxation rate of all the layers of the n-type $Al_XGa_{1-X}N$ (0.5≤X<1) layer was 0.5% or less.

The average driving voltage of each device of the fabricated light-emitting diode wafer was 8.0 V. The emission wavelength of the light-emitting diode flip-chip bonded on the ceramic mount was 263 nm, and the light emission output at a driving current of 400 mA was 52 mW. The results are summarized in Table 1.

Example 3

A semiconductor device (ultraviolet light-emitting element) was fabricated in the same manner as that in Example 1 except that the first n-type AlGaN layer 3 (X1=0.7, 250 nm) and the second n-type AlGaN layer 4 (X2=0.66, 200 nm) of the n-type $Al_xGa_{1-x}N$ (0.5≤X<1) layer 2 of Example 1 were replaced with each other. As a result of XRD-reciprocal lattice mapping measurements on the (114) plane in confirming the physical properties of the group III nitride stacked body, the lattice relaxation rate of all the layers of the n-type $Al_xGa_{1-x}N$ (0.5≤X<1) layer was 0.5% or less.

The average driving voltage of each device of the fabricated light-emitting diode wafer was 7.7 V. The emission wavelength of the light-emitting diode flip-chip bonded on the ceramic mount was 264 nm, and the light emission output at a driving current of 400 mA was 53 mW. The results are summarized in Table 1.

Comparative Example 1

A semiconductor device (ultraviolet light-emitting element) was fabricated in the same manner as that in Example 1 except that, in the formation of the n-type $Al_xGa_{1-x}N$ (0.5≤X<1) layer 2 of Example 1, the first n-type $Al_{X1}Ga_{1-X1}N$ (0.5≤X<1) layer 3 was formed to have a thickness of 700 nm (12.3 times the expected critical film thickness), the second n-type $Al_{X2}Ga_{1-X2}N$ layer 4 and the third n-type $Al_{X3}Ga_{1-X3}N$ layer 5 was not formed.

As a result of XRD-reciprocal lattice mapping measurements on the (114) plane in confirming the physical properties of the group III nitride stacked body, the relaxation rate of the n-type $Al_{0.7}Ga_{0.3}N$ layer (0.7 μm) was 0.5% or less.

The average driving voltage of each device of the fabricated light-emitting diode wafer was 8.8 V. The emission wavelength of the light-emitting diode flip-chip bonded on the ceramic mount was 263 nm, and the light emission output at a driving current of 400 mA was 51 mW. The results are summarized in Table 1.

TABLE 1

|  | Example 1 | Example 2 | Example 3 | Comparative Example |
|---|---|---|---|---|
| First n-type $Al_{X1}Ga_{1-X1}N$ layer |  |  |  |  |
| Al Composition (X1) | 0.70 | 0.70 | 0.66 | 0.70 |
| Film Thickness (nm) | 250 | 250 | 200 | 700 |
| Ratio to Predicted Critical Film Thickness | 4.4 | 4.4 | 4.0 | 12.3 |
| Second n-type $Al_{X2}Ga_{1-X2}N$ layer |  |  |  | No data |
| Al Composition (X2) | 0.66 | 0.80 | 0.70 | — |
| Film Thickness (nm) | 200 | 200 | 250 | — |
| Ratio to Predicted Critical Film Thickness | 4.0 | 2.2 | 4.4 | — |
| Third n-type $Al_{X3}Ga_{1-X3}N$ layer |  |  |  | No data |
| Al Composition (X3) | 0.73 | 0.73 | 0.73 | — |
| Film Thickness (nm) | 250 | 250 | 250 | — |
| Ratio to Predicted Critical Film Thickness | 3.7 | 3.7 | 3.7 | — |
| \| X1 − X2 \| | 0.04 | 0.10 | 0.04 | — |
| \| X2 − X3 \| | 0.07 | 0.07 | 0.03 | — |
| Total Film Thickness of n-type AlXGa1-XN layer (nm) | 700 | 700 | 700 | 700 |
| Lattice Relaxation Rate (%) | up to 0.5% | up to 0.5% | up to 0.5% | up to 0.5% |
| Emission Peak Wavelength (nm) | 264 | 263 | 264 | 263 |
| Average Driving Voltage (V) | 7.9 | 8.0 | 7.7 | 8.8 |
| Light Emission Output (mW) | 52 | 52 | 53 | 51 |

REFERENCE SIGNS LIST

1 AlN single crystal substrate
2 n-type $Al_xGa_{1-x}N$ layer
3 first n-type $Al_{X1}Ga_{1-X1}N$ layer
4 second n-type $Al_{X2}Ga_{1-X2}N$ layer
5 third n-type $Al_{X3}Ga_{1-X3}N$ layer
6 intermediate layer
7 active layer
8 electron-blocking layer
9 p-type layer
10 p-type GaN layer
11 p-type electrode

The invention claimed is:

1. A light emitting device which emits ultraviolet light, comprising:
   an AlN single crystal substrate;
   an n-type AlGaN layer formed on said AlN single crystal substrate and lattice matched to said AlN single crystal substrate, said n-type AlGaN layer comprising a first n-type $Al_{X1}Ga_{1-X1}N$ (0.5≤X1<1) layer, a second n-type $Al_{X2}Ga_{1-X2}N$ (0.5≤X2<1) layer, and a third n-type $Al_{X3}Ga_{1-X3}N$ (0.5≤X3<1) layer that are stacked in this order on a surface of said AlN single crystal substrate;
   an active layer stacked on said n-type AlGaN layer;
   a p-type AlGaN layer formed on said active layer; and
   an n-type electrode formed on said third n-type $Al_{X3}Ga_{1-X3}N$ layer,
   wherein X1, X2, and X3 indicating Al compositions of the respective layers satisfy 0<|X1−X2|≤0.1, and 0<|X2−X3|≤0.1,
   wherein said n-type electrode is formed at a position where a distance in a depth direction from said n-type electrode to an interface between said first n-type $Al_{X1}Ga_{1-X1}N$ layer and said second n-type $Al_{X2}Ga_{1-X2}N$ layer is at least 10 nm and less than 150 nm, or at a position where a distance in the depth direction from said n-type electrode to an interface between said second n-type $Al_{X2}Ga_{1-X2}N$ layer and said third n-type $Al_{X3}Ga_{1-X3}N$ layer is at least 10 nm and less than 150 nm.

2. The light emitting device according to claim 1, wherein said X1, X2, and X3 satisfy X1<X2 and X3<X2, or satisfy X2<X1 and X2<X3.

3. The light emitting device according to claim 1, wherein said X1, X2, and X3 satisfy X1<X2<X3.

4. The light emitting device according to claim 1, wherein a total thickness of said n-type AlGaN layer is at least 500 nm.

5. The light emitting device according to claim 1, having an emission peak wavelength of 210 to 350 nm.

* * * * *